Figure 1:
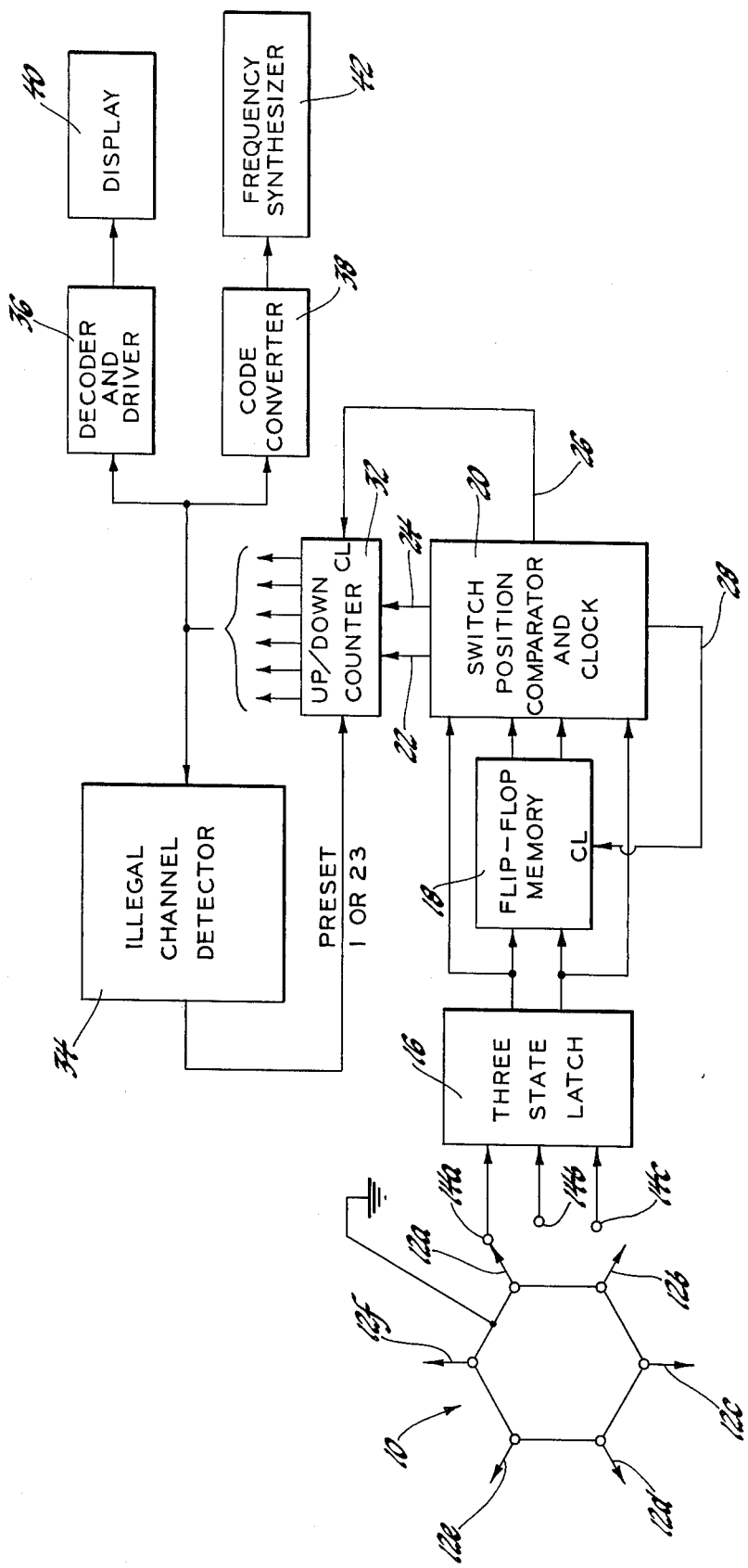

United States Patent [19]

Pogue, Jr.

[11] 4,065,720
[45] Dec. 27, 1977

[54] ELECTRONIC CHANNEL SELECTOR

[75] Inventor: Russell W. Pogue, Jr., Kokomo, Ind.

[73] Assignee: General Motors Corporation, Detroit, Mich.

[21] Appl. No.: 779,017

[22] Filed: Mar. 18, 1977

[51] Int. Cl.² ............................................. H03K 21/36
[52] U.S. Cl. ................................. 325/464; 325/455;
325/25; 235/92 EV; 235/92 CA; 340/347 C
[58] Field of Search .............. 325/464, 465, 455, 457,
325/20, 25, 470; 235/92 MP, 92 EV, 92 K, 92
C, 92 CA, 92 G; 340/347 C, 357; 334/86, 87

[56] References Cited

U.S. PATENT DOCUMENTS

| | | | |
|---|---|---|---|
| 3,440,640 | 4/1969 | Droniou et al. | 235/92 K |
| 3,548,169 | 12/1970 | Tonneri | 235/92 CA |
| 3,733,472 | 5/1973 | Taisne | 235/92 CA |
| 3,818,342 | 6/1974 | Stevens | 235/92 CA |
| 3,908,116 | 9/1975 | Bjornsen | 235/92 CA |
| 3,937,932 | 2/1976 | Ahlgren | 235/92 CA |
| 3,965,336 | 6/1976 | Grohmann | 325/455 |
| 3,970,828 | 7/1976 | Klien | 235/92 CA |
| 3,988,681 | 10/1976 | Schurmann | 325/470 |

Primary Examiner—Benedict V. Safourek
Assistant Examiner—Tommy P. Chin
Attorney, Agent, or Firm—Howard N. Conkey

[57] ABSTRACT

An electronic channel selector is described for providing a tuning signal at a frequency corresponding to a selected channel. A logic circuit cooperates with an uncoded rotary switch for providing control signals to an up/down counter which counts up or down in response to rotation of a rotary switch in a clockwise or counterclockwise direction and which provides a digital signal representing a selected channel. The digital signal from the up/down counter controls a channel display and frequency synthesizer.

3 Claims, 2 Drawing Figures

ELECTRONIC CHANNEL SELECTOR

This invention relates to electronic channel selectors and more particularly to electronic channel selectors employing uncoded rotary switches.

Channel selectors for tuning transmitters and/or receivers to tuning frequencies associated with particular channels generally employ mechanical rotary switches having a number of stationary contacts angularly spaced with the number of stationary contacts being equal to the number of channels to which the receiver or transmitter can be tuned. For example, in CB receivers, channel selectors have employed twenty-three separate channels which may be selected thereby requiring twenty-three contacts on the rotary switch. With the advent of 40 channels on CB receivers, the conventional channel selecting rotary switches will require a greater number of stationary contacts. As opposed to the aforementioned channel selectors, it is the general object of this invention to provide for an electronic channel selector employing an uncomplicated, uncoded rotary switch.

It is another object of this invention to provide for an electronic channel selector in which an up/down counter is controlled in response to the rotation of an uncoded rotary switch so as to provide an output digital signal used for frequency selection.

These and other objects of this invention are accomplished by a multiple position continuous rotation switch having three states repeated cyclically. In this respect, the rotary switch has N discrete angular positions, N/3 movable angularly spaced grounded contacts and three stationary contacts angularly spaced so as to be sequentially engaged in a first order by the movable contacts as the rotary switch is rotated to sequential angular positions in a clockwise direction and in a second or opposite order when the rotary switch is rotated to sequential angular positions in a counterclockwise direction. A three state latch circuit is coupled to the stationary contacts and provides a digital signal which identifies the last stationary contact engaged by one of the movable grounded contacts of the rotary switch. A memory circuit is responsive when clocked to memorize the digital signal provided by the latch circuit. A comparator and clock circuit is responsive to a change in the digital signal provided by the latch circuit from the digital signal memorized by the memory circuit and provides in timed sequence (A) an up/down control signal, (B) an up/down counter clock signal and (C) a memory circuit clock signal. The up/down counter is responsive to the up/down control signal and the up/down counter clock signal to provide a digital signal representing a particular channel number. The memory circuit clock signal enables the memory circuit to memorize the state of the rotary switch immediately after the last change occurred. At this time, the circuit is in a condition to again respond to rotation of the rotary switch.

Figure 2:
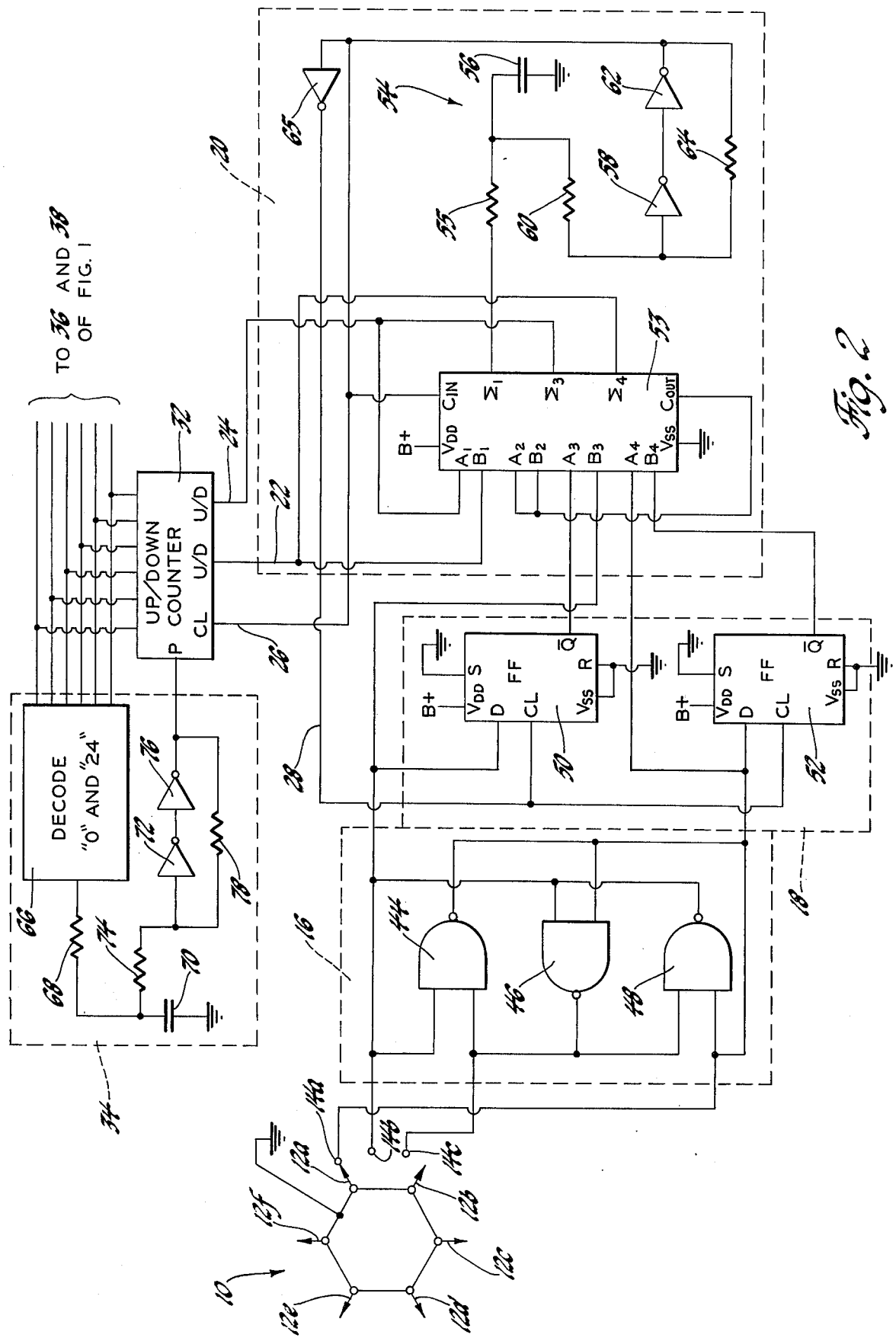

The invention may be best understood by reference to the following description of a preferred embodiment and the drawings in which:

FIG. 1 is a block diagram of the electronic channel selector of this invention, and FIG. 2 is a logic diagram illustrating the preferred embodiment of the invention.

Referring to FIG. 1, the electronic channel selector includes an uncoded rotary switch 10 which has a number N discrete angular positions. The rotary switch 10 has N/3 movable angularly spaced contacts 12a-12f which are electrically grounded and three stationary contacts 14a-14c. The three stationary contacts 14a-14c are angularly spaced so as to be sequentially engaged and thereby grounded in a first order by the movable contacts 12a-12f as the rotary switch 10 is rotated to sequential angular positions in a clockwise direction and in a second order opposite to the first order when the rotary switch 10 is rotated to sequential angular positions in a counterclockwise direction. For example, the rotary switch 10 is illustrated in FIG. 1 as having the movable contact 12a engaging the stationary contact 14a. Rotation of the rotary switch 10 in a clockwise direction causes the contact 12a to next engage the contact 14b and thereafter the contact 14c. Further rotation of the rotary switch 10 in a clockwise direction results in the contact 12f engaging the contact 14a. This sequence is repeated as long as the rotary switch is continually rotated in a clockwise direction. Upon rotation of the rotary switch 10 in a counterclockwise direction from the position illustrated in FIG. 1, the contact 12f moves out of engagement with the contact 14a and the contact 12b engages the contact 14c. Continued rotation of the switch 10 in a counterclockwise direction results in the rotary contact 12b engaging contact 14b and thereafter the contact 14a. This sequence is repeated as long as the rotary switch is continually rotated in a counterclockwise direction.

The contacts 14a-14c (one grounded and two ungrounded) are coupled to a three-state latch 16 which provides a digital signal identifying the last one of the stationary contacts 14a-14c grounded by one of the movable contacts 12a-12f. The digital signal output of the three-state latch 16 is coupled to a flip-flop memory 18 and to a switch position comparator and clock 20.

The flip-flop memory 18 is responsive to a clock signal to memorize and provide at its output, a signal identical to the output of the three-state latch 16. The switch position comparator and clock 20 compares the present position of the rotary switch 10 as represented by the output of the three-state latch 16 and the position of the rotary switch 10 represented by the output of the flip-flop memory 18 and when the digital signal output of the three-state latch 16 varies from the digital signal output of the flip-flop memory 18 provides in timed sequence: (A) up/down control signals on output lines 22 and 24, (B) a clock signal on an output line 26 and (C) a clock signal on an output line 28. The clock signal on the line 28 sets the output of the flip-flop memory 18 to the output of the three-state latch 16 so that the output of the flip-flop memory 18 then represents the rotary switch 10 position and is the same as the output of the three-state latch 16. Thereafter and until the rotary switch 10 is rotated to another angular position, the output of the three-state latch 16 and the flip-flop memory 18 are identical.

The up/down control signals on lines 22 and 24 and the clock signal on line 26 are coupled to an up/down counter 32. Upon the occurrence of the clock signal on line 26, the up/down counter 32 increments in an up direction when the output of the comparator and clock 20 on lines 22 and 24 represents rotation of the switch 10 in a first direction, such as a clockwise direction, and increments in a down direction by one count when the output of the comparator and clock 20 on lines 22 and 24 represents rotation of the switch in the opposite direction, such as a counterclockwise direction.

The output of the up/down counter 32 is a digital signal which represents a selected channel for the receiver or transmitter. This digital signal is coupled to an illegal channel detector 34, a decoder and driver 36 and a code converter 38. The decoder and driver 36 decodes the digital output of the up/down counter 32 and drives a display 40 which identifies the channel represented by the output of the up/down counter 32. The code converter 38 converts the digital output of the up/down counter 32 and controls a frequency synthesizer 42 which generates a tuning frequency corresponding to the channel represented by the digital output of the up/down counter 32.

The illegal channel detector 34 sets the output of the up/down counter 32 to a selected channel when the up/down counter 32 is clocked to an illegal channel. For example, if the electronic channel selector of FIG. 1 is used in a 23-channel receiver-transmitter, the illegal channel selector 34 decodes the digital output of the up/down counter 32 and presets the output so as to represent channel 1 when the up/down counter is clocked in an up direction from channel 23 to an illegal channel 24. Conversely, when the up/down counter output is clocked in a down direction from channel 1, the illegal channel selector 34 decodes the resulting output and presets the counter output so as to represent channel 23. In this manner, only digital signals representing the channels 1 through 23 are provided to the decoder and driver 36 and the code converter 38.

Referring to FIG. 2, there is illustrated a schematic diagram of the electronic channel selector. The three-state latch 16 is comprised of three cross coupled NAND gates 44, 46 and 48. The stationary contact 14c is coupled to an input of the NAND gate 44 and to an input of the NAND gate 48, the contact 14b is coupled to the second input of the NAND gate 44, and the contact 14a is coupled to the second input of the NAND gate 48. The output of the three-state latch circuit 16 is provided by the NAND gates 44 and 48 whose outputs are coupled to the inputs of the NAND gate 46 whose output is coupled to the inputs of the NAND gates 44 and 48 that are coupled to the contact 14c. The three-state latch 16 functions to provide a binary code identifying the last one of the stationary contacts 14a-14c engaged by one of the movable contacts 12a-12f.

The outputs of the three-state latch 16 are coupled to the data inputs of flip-flops 50 and 52 which comprise the flip-flop memory 18. The outputs of the three-state latch 16 are provided in inverted form at the $\bar{Q}$ outputs of the flip-flops 50 and 52 upon the transition of the inputs to the clock input terminals from a digital logic 0 to a digital logic 1. Thereafter, the output of the three-state latch 16 is memorized until the flip-flops are again clocked by a clock signal supplied thereto.

The switch position comparator and clock 20 includes a four-bit full adder 53 coupled so as to compare the digital output of the three-state latch 16 and the flip-flop memory 18. The four-bit full adder may take the form of the four-bit full adder model number CD4008A manufactured by RCA Corporation. The outputs of the three-state latch 16 are coupled to the $B_3$ and $A_4$ inputs of the four-bit full adder and the outputs of the flip-flop memory 18 are coupled to the $A_3$ and $B_4$ inputs of the four-bit full adder. Upon a change in the state of the digital output of the three-state latch 16 from the state of the digital output of the flip-flop memory 18, the four-bit full adder provides a logic 1 level pulse at the summation output 1 and provides outputs on the summation outputs 3 and 4 which represents rotation of the switch 10 in a clockwise or in a counterclockwise direction. For example, when the switch 10 is rotated in a clockwise direction, the summation output 3 shifts to a logic 1 state and the summation output 4 goes to a logic 0 state. However, upon counterclockwise rotation of the switch 10, the summation output 3 goes to a logic 0 state and the summation output 4 goes to a logic 1 level. These outputs representing the direction of rotation of the switch 10 set the up/down counter 32 in either a count up mode for clockwise rotation of switch 10 or in a count down mode upon counterclockwise rotation of the switch 10.

The summation output 1 is coupled to a clock 54 which is triggered thereby to generate the clock pulses on lines 26 and 28. In this respect, the summation output 1 is coupled across a resistor 55 and a capacitor 56. The voltage across the capacitor 56 is coupled to the input of an inverter 58 through a resistor 60. The output of the inverter 58 is coupled to the input of an inverter 62 whose output is fed back to the input of the inverter 58 through a resistor 64. The output of the inverter 62 comprises one of the clock signal outputs of the clock 54 which is coupled to the clock input of the up/down counter 32. The up/down counter is clocked on the leading edge or logic 0 to logic 1 transition of the clock signal output of the inverter 62. This clock signal is also coupled to an inverter 65 which supplies the clock signal to the flip-flop memory 18 on the line 28. The flip-flop memory 18 is clocked on the trailing edge or logic 0 to logic 1 transition of the clock signal output of the inverter 65. The clock signal from the inverter 62 is also coupled to the carry-in input of the four-bit full adder 53 which forces the summation output 1 to logic 0 for the duration of the clock signal.

The illegal channel detector 34 includes a decoder 66 which is a logic circuit of conventional form which is provided to decode digital outputs of the up/down counter 32 representing all illegal codes including channels 0 and 24 (in the case of a 23-channel selector). Upon the detection of the illegal channels 0 and 24, a logic 1 pulse is provided by the decoder 66 which is coupled across a resistor 68 and a capacitor 70 in a clock pulse generator identical to the clock 54. In this respect, the voltage across the capacitor 70 is coupled to the input of an inverter 72 through a resistor 74. The output of the inverter 72 is coupled to the input of an inverter 76 whose output is fed back to the input of the inverter 72 through a resistor 78. The output of the inverter 76 comprises a clock pulse which is coupled to the preset input of the up/down counter 32 which is preset to represent channel 1 when the up/down counter is in a count-up mode and preset to represent channel 23 when the up/down counter is in a count-down mode. In this manner, the up/down counter counts up or down only through the desired channels 1 through 23.

Assuming an initial condition with the stationary contact 14a engaged by the movable contact 12a and the flip-flops 50 and 52 clocked so that the outputs thereof and the outputs of the three-state latch 16 each identify the engagement of the contacts 14a by the contact 12a, the operation is as follows. The up/down counter 32 represents a particular channel which is displayed on the display 40 and the frequency synthesizer 42 supplies a signal with a frequency associated with the displayed channel. Assuming rotation of the switch 10 in a clockwise direction so that the stationary contact 14b is next engaged by the contact 12a, the three-state latch 16 is forced to a corresponding digital output representing the engagement of the contact 14b by the contact 12a. Upon sensing this change in the output of the three-state latch 16, the switch position comparator 53 generates the one-bit pulse at the summation output 1 and further generates count-up logic signals at the summation outputs 3 and 4 which set the up/down counter 32 in a count-up mode. The one-bit pulse from the switch position comparator 53 triggers the clock generator 54 which generates a clock signal, the leading edge of which clocks the up/down counter whose output increments up by 1 count. The resulting digital output of the up/down counter increases the numeral on the display 40 by one and further changes the frequency of the signal provided by the frequency synthesizer 42 so as to correspond to the newly selected channel. Upon termination of the clock signal to the up/down counter 32, the clock signal on line 28 is provided to the flip-flops 50 and 52 which are clocked to enter the output of the three-state latch 16. The outputs of the three-state latch 16 and the flip-flop memory 18 again represent the same position of the switch 10. In the same manner, the up/down counter 32 is clocked in a down direction if the switch 10 is rotated in a counter-clockwise direction from the position illustrated in FIG. 2 so that the contact 12b engages the contact 14c.

The foregoing sequence is continually repeated upon rotation of the switch 10 so that the output of the up/down counter continually provides a representation of the selected channel.

The description of the preferred embodiment of the invention for the purpose of illustrating the principles thereof is not to be considered as limiting or restricting the invention since many modifications may be made by the exercise of skill in the art without departing from the scope of the invention.

I claim:

1. An electronic channel selector for providing a signal representing a selected channel, the selector comprising:

a rotary switch having the number N discrete angular positions, N/3 movable angularly spaced contacts, and three stationary contacts angularly spaced so as to be sequentially engaged in a first order by the movable contacts as the rotary switch is rotated to sequential angular positions in a clockwise direction and in a second order opposite to the first order when the rotary switch is rotated to sequential angular positions in a counterclockwise direction;

a latch means coupled to the stationary contacts effective to provide a first digital signal identifying the last stationary contact engaged by one of the movable contacts;

a memory means effective when clocked, to memorize the first digital signal provided by the latch means;

a comparator means responsive to the signal memorized by the memory means and the first digital signal provided by the latch means, the comparator means being effective in timed sequence when the first digital signal provided by the latch means changes from the signal memorized by the memory means to provide (A) an up/down control signal, (B) an up/down clock signal and (C) a memory clock signal for clocking the memory means, the up/down control signal being in a count-up state when the signal memorized by the memory means and the first digital signal provided by the latch means represents clockwise rotation of the rotary switch and being in a count-down state when the signal memorized by the memory means and the first digital signal provided by the latch means represents counterclockwise rotation of the rotary switch; and an up/down counter effective to count in successive steps the up/down clock signals in an up or down direction in dependence upon the state of the up/down control signal and to provide a second digital signal representing a selected channel, the selected channel being changed in an up or down direction in dependence upon rotation of the rotary switch in a clockwise or counterclockwise direction.

2. An electronic channel selector for providing a signal representing a selected one of channel numbers one through X, the selector comprising:

a rotary switch having the number N discrete angular positions, N/3 movable angularly spaced contacts, and three stationary contacts angularly spaced so as to be sequentially engaged in a first order by the movable contacts as the rotary switch is rotated to sequential angular positions in a clockwise direction and in a second order opposite to the first order when the rotary switch is rotated to sequential angular positions in a counterclockwise direction;

a latch means coupled to the stationary contacts effective to provide a first digital signal identifying the last stationary contact engaged by one of the movable contacts;

a memory means effective when clocked, to memorize the first digital signal provided by the latch means;

a comparator means responsive to the signal memorized by the memory means and the first digital signal provided by the latch means, the comparator means being effective in timed sequence when the first digital signal provided by the latch means changes from the signal memorized by the memory means to provide (A) an up/down control signal, (B) an up/down clock signal and (C) a memory clock signal for clocking the memory means, the up/down control signal being in a count-up state when the signal memorized by the memory means and the first digital signal provided by the latch means represents clockwise rotation of the rotary switch and being in a count-down state when the signal memorized by the memory means and the first digital signal provided by the latch means represents counterclockwise rotation of the rotary switch;

an up/down counter effective to count in successive steps the up/down clock signals in an up or down direction in dependence upon the state of the up/down control signal and to provide a second digital signal representing a selected one of the channels one through X, the selected channel being changed in an up or down direction in dependence upon rotation of the rotary switch in a clockwise or counterclockwise direction; and an illegal channel monitor responsive to the second digital signal provided by the up/down counter effective to set the second digital signal to represent channel one when the second digital signal represents the number (X + 1) and the up/down control signal is in a count-up state and set the second digital signal to represent channel X when the second digital signal represents the number zero and the up/down control signal is in a count-down state.

3. An electronic channel selector for providing a signal representing a selected channel, the selector comprising:

a rotary switch having the number N discrete angular positions, N/3 movable angularly spaced contacts, and three stationary contacts angularly spaced so as to be sequentially engaged in a first order by the movable contacts as the rotary switch is rotated to sequential angular positions in a clockwise direction and in a second order opposite to the first order when the rotary switch is rotated to sequential angular positions in a counterclockwise direction;

a latch means coupled to the stationary contacts effective to provide a first digital signal identifying the last stationary contact engaged by one of the movable contacts;

a memory means effective, when clocked, to memorize the first digital signal provided by the latch means;

a comparator means responsive to the signal memorized by the memory means and the first digital signal provided by the latch means, the comparator means being effective in timed sequence when the first digital signal provided by the latch means changes from the signal memorized by the memory means to provide (A) an up/down control signal, (B) an up/down clock signal and (C) a memory clock signal for clocking the memory means, the up/down control signal being in a count-up state when the signal memorized by the memory means and the first digital signal provided by the latch means represents clockwise rotation of the rotary switch and being in a count-down state when the signal memorized by the memory means and the first digital signal provided by the latch means represents counterclockwise rotation of the rotary switch;

an up/down counter effective to count in successive steps the up/down clock signals in an up or down direction in dependence upon the state of the up/down control signal and to provide a second digital signal representing a selected channel, the selected channel being changed in an up or down direction in dependence upon rotation of the rotary switch in a clockwise or counterclockwise direction;

frequency synthesizer means responsive to the second digital signal provided by the up/down counter effective to provide a tuning signal having the frequency associated with the selected channel; and indicator means responsive to the second digital signal provided by the up/down counter effective to provide a visual indication of the selected channel.

* * * * *